(12) United States Patent
Agarwal

(10) Patent No.: US 6,930,041 B2
(45) Date of Patent: *Aug. 16, 2005

(54) PHOTO-ASSISTED METHOD FOR SEMICONDUCTOR FABRICATION

(75) Inventor: Vishnu K. Agarwal, Boise, ID (US)

(73) Assignee: Micron Technology, Inc., Boise, ID (US)

(*) Notice: Subject to any disclaimer, the term of this patent is extended or adjusted under 35 U.S.C. 154(b) by 46 days.

This patent is subject to a terminal disclaimer.

(21) Appl. No.: 10/435,048

(22) Filed: May 12, 2003

(65) Prior Publication Data

US 2003/0232500 A1 Dec. 18, 2003

Related U.S. Application Data

(63) Continuation-in-part of application No. 09/730,773, filed on Dec. 7, 2000, now Pat. No. 6,576,564.

(51) Int. Cl.[7] .............................................. H01L 21/324
(52) U.S. Cl. ...................... 438/660; 438/720; 438/727; 438/711
(58) Field of Search .................. 257/E21.582; 438/660, 438/711, 720, 727

(56) References Cited

U.S. PATENT DOCUMENTS

| | | | |
|---|---|---|---|
| 4,842,676 A | | 6/1989 | Jucha et al. |
| 4,913,929 A | | 4/1990 | Moslehi et al. |
| 4,937,094 A | * | 6/1990 | Doehler et al. ............. 427/574 |
| 4,996,077 A | | 2/1991 | Moslehi et al. |
| 5,018,479 A | | 5/1991 | Markunas et al. |
| 5,028,452 A | * | 7/1991 | Beatty ......................... 427/571 |
| 5,180,435 A | | 1/1993 | Markunas et al. |
| 5,252,178 A | | 10/1993 | Moslehi |
| 5,522,343 A | | 6/1996 | Kodama et al. |
| 5,647,913 A | | 7/1997 | Blalock |
| 5,662,770 A | | 9/1997 | Donohoe |
| RE35,785 E | | 5/1998 | Sandhu et al. |
| 5,753,886 A | | 5/1998 | Iwamura et al. |
| 6,095,085 A | * | 8/2000 | Agarwal .............. 118/723 MP |
| 6,096,597 A | | 8/2000 | Tsu et al. |
| 6,153,529 A | * | 11/2000 | Agarwal ...................... 438/708 |
| 2002/0009861 A1 | | 1/2002 | Narwankar et al. |

FOREIGN PATENT DOCUMENTS

EP          0 291 181 A2    4/1988

* cited by examiner

Primary Examiner—George Fourson
(74) Attorney, Agent, or Firm—Dickstein Shapiro Morin & Oshinsky LLP

(57) ABSTRACT

The present invention provides a processing system comprising a remote plasma activation region for formation of active gas species, a transparent transfer tube coupled between the remote activation region and a semiconductor processing chamber, and a source of photo-energy for maintaining activation of the active species or providing photo-energy for a non-plasma species during transfer through the transparent tube to the processing chamber. The source of photo-energy preferably includes an array of UV lamps. Additional UV lamps may also be used to further sustain active species and assist processes by providing additional in-situ energy through a transparent window of the processing chamber. The system can be utilized for processes such as layer-by-layer annealing and deposition and also removal of contaminants from deposited layers.

28 Claims, 1 Drawing Sheet

PHOTO-ASSISTED METHOD FOR SEMICONDUCTOR FABRICATION

This application is a continuation-in-part of U.S. patent application Ser. No. 09/730,773, filed Dec. 7, 2000 now U.S. Pat. No. 6,576,564, the entirety of which is hereby incorporated herein by reference.

FIELD OF THE INVENTION

The present invention relates to semiconductor fabrication processes, more particularly to a photo-assisted method for semiconductor fabrication.

BACKGROUND

"Plasma-assisted" or "plasma-enhanced" processing has many applications in semiconductor device fabrication. Plasma-enhanced processing is a technique in which a substantially ionized gas generates active, metastable neutral and ionic species that chemically or physically react to deposit thin material layers on, or to etch material layers from, a semiconductor substrate in a reactor processing chamber.

Advanced semiconductor VLSI technologies employ plasma processing for a number of important steps in device fabrication. For example, plasma processing permits lower processing temperatures and higher deposition rates for growth and deposition of thin layers of insulators, semiconductors, or metals. In addition, reactive ion etching (RIE) processes in low-pressure plasmas are used for anisotropic patterning of the submicron features in VLSI device structures.

Plasma-enhanced processing may use remotely-generated or locally-generated plasmas. A remote plasma is a plasma that is generated external to the reactor's semiconductor processing chamber. The plasma is guided into the processing chamber through a conduit from a remote plasma source, which is separated from the processing chamber where the plasma interacts with the semiconductor wafer for the desired fabrication process. An in-situ or localized plasma is a plasma that is generated within the semiconductor processing chamber where it interacts with the semiconductor wafer.

Conventional plasma processing equipment for etch and deposition applications usually employ a 13.56 MHz power source, a 2.5 GHz microwave source, or a combination of these energy sources for generating a plasma (glow discharge) from plasma feed gas. In typical systems, a plasma-generating radio-frequency power source connects electrically to an electrically conducting wafer holding device known as a wafer chuck. A radio-frequency energy source causes the chuck and wafer to produce a locally-generated radio-frequency plasma in the processing chamber with the semiconductor wafer. These systems typically include a showerhead assembly for injecting plasma-generating feed gas into the processing chamber.

This is known as a parallel-plate configuration, due to the parallel surfaces of the chuck and showerhead. Still other configurations use a combination of local and remote plasmas.

In all of these known configurations, constraints exist which limit plasma process flexibility and capabilities. In localized plasma enhanced chemical vapor deposition (PECVD), for example, parent gas molecules are dissociated into precursor atoms and radicals which can deposit on substrates. The plasma supplies energy to break chemical bonds in the parent molecules that would only be broken by thermal decomposition if the plasma were not present. Parent molecule dissociation is accomplished in the plasma through collisions with electrons, ions, photons, and excited neutral species. Unfortunately, the precursor species are also subject to the same active environment which dissociated the parent molecules. This can lead to further dissociation or reaction of gas phase species to form more complicated radicals before the radicals can condense on the substrate. There is thus a wide spectrum of precursor species incident on the growing film.

A further complication of localized PECVD is that the substrate is immersed in the plasma region. This results in a large flux of charged species incident on the substrate during film deposition. This can lead to ion implantation, energetic neutral embedment, sputtering, and associated damage.

In addition, localized PECVD tends to deposit film in a very directional manner. This limits step coverage and conformality, resulting in thicker films in certain areas and thinner films in others, particularly at the bottom and along the bottom portions of trenches and contact vias. Thus, there are three major problems associated with conventional in-situ PECVD: adequate control over incident gas phase species, ion damage as a result of the substrate being immersed in the plasma region, and limited step coverage and conformality.

The use of a remote plasma system for remote plasma enhanced chemical vapor deposition (RPECVD) can help to alleviate all of these problems, but raises additional limitations relating to the transfer of active plasma species from the remote source to the semiconductor processing chamber. The lifetime of metastable oxygen, for example, typically allows pathlengths of 1–2 meters in the transfer conduit from a remote plasma source to the semiconductor processing chamber. The pathlength of a typical metastable excited noble gas species, e.g., He*, is only 5–30 cm. Nitrogen and various other activated species important to plasma-enhanced processing have similarly short, or even shorter, pathlengths. Therefore, an important limitation of remote plasma reactors is that desired activated species often cannot reach the semiconductor substrate in a sufficiently activated state and adequate concentration for efficient plasma-enhanced processing.

Annealing can be utilized to remove contaminants from conductive films, as well as for other reasons, in semiconductor processing. Such annealing processes are being performed using conventional remote plasma processes. When performed utilizing remote plasma, similar problems are found as described above in relation to other plasma processing techniques.

It would be advantageous to have a plasma-enhanced apparatus and method which overcomes the above discussed problems in the prior art techniques, including inadequacy of the control over incident gas phase species, ion damage to the substrate, limited step coverage/conformality, and the limited lifetime and diffusion length of the active species generated by remote plasma sources. A remote plasma anneal process would be desirable to lower DT and produce more effective anneals. Additionally, methods for forming semiconductors that would provide greater control over the consistency and quality of a fabricated device would be advantageous as well.

SUMMARY

Embodiments of the invention provide a processing apparatus and method including a remote plasma activation region for formation of active gas species and a transparent transfer tube coupled to a semiconductor processing chamber. A source of photo-energy is provided to sustain activation of the active species or provide photo-energy to a non-plasma species during transfer through the transparent tube to the processing chamber. The source of photo-energy preferably includes an array of UV lamps. Additional UV lamps or other photo-energy sources may also be used to further sustain active species and assist processes by providing additional energy through a transparent wall of the processing chamber. The apparatus of the invention may be used for a variety of processes, including, but not limited to, any plasma-enhanced processing technique, such as RPECVD and RIE, and is particularly well-suited for any techniques in semiconductor fabrication or other plasma-assisted processes using plasma-activated species having relatively short lifetimes. The process of the invention is also effective in producing superior anneals.

The invention is particularly suited for removal of contaminants from conductive films. Such conductive films may be deposited using the apparatus as well. Additionally, the invention is particularly suited for layer-by-layer deposition and/or annealing of thin films. These and other advantages of the invention will be more apparent from a reading of the following detailed description in view of the accompanying FIGURE.

DETAILED DESCRIPTION OF THE PREFERRED EMBODIMENTS

Figure 1:
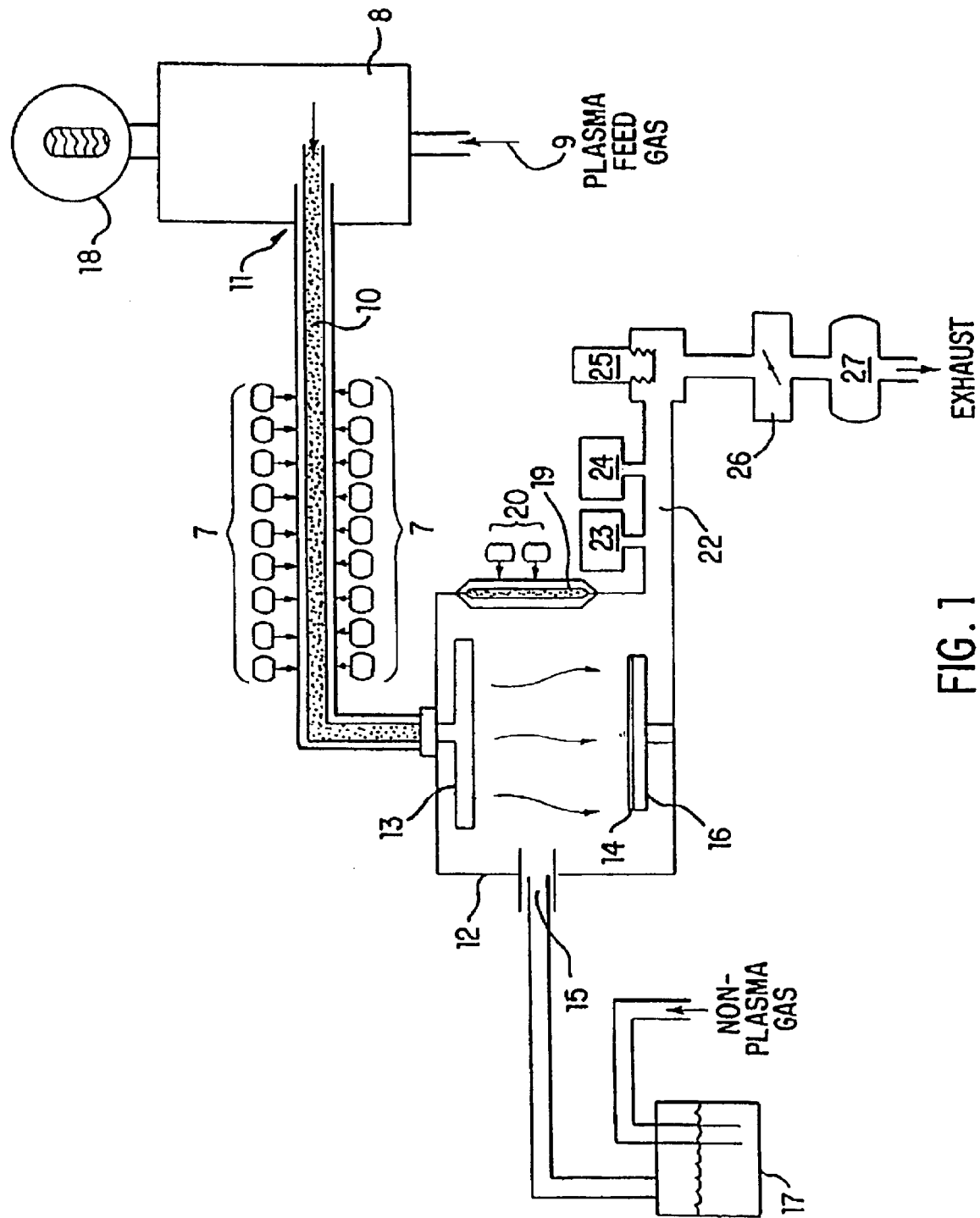
FIG. 1 is a schematic diagram of one embodiment of the reactor system, including remote plasma generation and photo-assist equipment in accordance with the invention.

In the following detailed description reference is made to various specific embodiments in which the invention may be practiced. These embodiments are described in sufficient detail to enable those skilled in the art to practice the invention, and it is to be understood that other embodiments may be utilized and that specific equipment, processing steps, energy sources, and other changes may be made without departing from the spirit and scope of the present invention.

The terms "wafer" or "substrate" are used interchangeably herein and include any semiconductor-based or other structure having an exposed surface in which to form a structure using the apparatus or method of this invention. Wafer and substrate are to be understood as including silicon-on-insulator, doped and undoped semiconductors, epitaxial layers of silicon supported by a base semiconductor foundation, and other semiconductor structures. Furthermore, when reference is made to a wafer or substrate in the following description, previous process steps may have been utilized to form active devices, regions or junctions in the base semiconductor structure or foundation.

The reactor apparatus of the invention as discussed below includes a remote plasma generation region for activation of a gas or mixture of gases, and photo-assisted maintenance of activation from the remote region of activation to the processing chamber where film deposition, annealing, etching, or other fabrication steps take place over a substrate within the processing chamber. Applications of the photo-assisted remote plasma apparatus and method of the invention for plasma-enhanced processing in semiconductor device manufacturing can include, but are not limited to: remote plasma-enhanced chemical-vapor deposition (RPECVD) of dielectrics, silicon, tungsten nitride $WN_x$), titanium, aluminum, copper, and other materials; high-rate reactive-ion etching (RIE) of, e.g., thin films of polysilicon, metal, oxides, nitrides, and polyimides; planarized inter-level dielectric formation, including procedures such as biased sputtering; low-temperature epitaxial semiconductor growth processes; and other applications and methods which will be apparent to those of skill in the art given the teachings herein. Once deposited, these materials, particularly dielectrics, can also be annealed using the apparatus.

FIG. 1 shows a diagram of a remote plasma photo-assisted processing apparatus according to the present invention. A feed gas stream (single gas, vapor, or mixture) enters remote plasma generation region 8 at plasma feed gas injector port 9. Within the remote plasma generation region 8, the plasma feed gas has its internal energy activated, i.e., increased, in one or more of a variety of ways. For example, one or more components of the feed gas may be ionized; one or more components of the feed gas may be dissociated into more reactive species; or the internal energy of the feed gas may be increased without ionization. This can be accomplished by equipment internal to the remote plasma generation region 8 by, e.g., heaters, catalytic surfaces, or electron or ion bombardment sources, or by equipment external to the remote plasma generation region 8 by, e.g., microwave sources, radio frequency sources, or heaters. Whatever the plasma feed gas, the method for activation, or the active species formed in the remote plasma generation region 8, energy is coupled into one or more gases, and that energy is sustained by a photo-energy source 7 as the active species is/are transferred through transparent conduit 10 to contribute to subsequent reactions in the processing chamber 11.

In the remote plasma generation region 8, only gases from the plasma feed gas injector 9 are present. Other gases that may be present in other regions of the apparatus cannot reach the remote plasma generation region 8 by diffusion or other processes that would allow such gases to enter through the exit 11 of remote plasma generation region 8 into transparent conduit 10. In the flow system shown in FIG. 1, the physical separation of the various regions of the reactor, coupled with the flow velocity of the gas stream, which of course depends on the selection of process parameters in those regions, prevents back-diffusion of gases into remote plasma generation region 8.

Referring again to FIG. 1, a microwave generator 18, controlled by a tuner and power meter (not shown), adjacent to the remote plasma generation region 8 provides power to create a "plasma" (glow discharge) of the plasma feed gas in remote plasma generation region 8. A pure noble gas plasma feed gas, nitrogen or hydrogen, are typically used for RPECVD, but the apparatus of the invention is not limited to any particular gas or gas mixtures. The plasma feed gas may also contain, for example, $WF_6$. The plasma environment in the remote plasma generation region 8 can typically contain many active species, even with a simple feed gas like helium. The active species produced in remote plasma generation region 8 can include ions, electrons, and a host of excited species with different lifetimes.

A photo-energy source 7 is positioned so as to direct photo-energy through the transparent conduit 10 to the active species generated in remote plasma region 8 as the active species flows through conduit 10 toward processing chamber 12. Photo-energy source 7 can include any source of photo-energy capable of sustaining the activity of one or more activated plasma species within conduit 10. The preferred sources of photo-energy are laser energy and UV lamps, most preferably, an array of UV lamps, but other sources may also be used so long as one or more of the active species generated in remote plasma generation region 8 have a higher energy level when they reach processing chamber 12 than such species would have in the absence of the photo-energy transferred from photo-energy source 7.

The flow through the remote generation region 8 carries the species downstream through the transparent conduit 10 to the plasma showerhead 13 and substrate 14 mounted in a deposition region downstream of the showerhead 13 in processing chamber 12. The transparent conduit 10 provides a sealed pathway through which the activated species from remote plasma generation region 8 can flow to enter processing chamber 12. Conduit 10 can be manufactured from quartz, sapphire or any transparent material that is inert or substantially non-reactive with respect to the active species. The preferred materials for the walls of conduit 10 are transparent quartz, non-reactive polymers, or a combination of quartz and non-reactive polymers provided in one or more concentric layers to make up the wall of the transfer tube.

The distance that the various species can travel before they are annihilated depends upon their lifetimes, the flow velocity, and the intensity of photo-assist produced by photo-energy source 7. The degree of photo-assist and the flow velocity of the plasma feed gases through injector port 9 can be controlled so as to maintain and control the concentration of desired active species at a given distance downstream of the remote plasma generation region 8, such as at the interaction region of the processing chamber 12 for desired active species, and at a point in the transparent conduit 10 prior to the interaction region for any undesired active species, which will depend upon the particular fabrication technique being conducted in processing chamber 12.

The transparent conduit 10 may also provide a pathway through which a non-plasma gas or gas mixture may enter processing chamber 12. A non-plasma gas entering processing chamber 12 via the conduit 10 may be exposed to the photo-energy by photo-energy source 7 and, thereby, achieve an increased energy to facilitate subsequent reaction processes. The amount of energy received by the non-plasma gas in conduit 10 will depend on the intensity of photo-energy source 7 and the gas flow rate.

Also, if desired, a non-plasma parent gas, carrier gas, secondary precursor gas, or other gas or gas mixture (collectively referred to herein as "non-plasma gas") may be transferred through the non-plasma gas injector port 15 to interact with the activated plasma species in the processing chamber 12. Optionally, the non-plasma gas from the non-plasma gas injector port 15 may be mixed with an active species in a premix chamber (not shown) prior to entering the processing chamber 12, or they may be mixed in showerhead 13.

The photo-assisted apparatus can be employed in a variety of processing systems. The apparatus is particularly suited for any plasma-enhanced processing system where remote plasma generation is used. Preferred applications of the apparatus of the invention include chemical vapor deposition of, for example, thin films of Ti, TiN, or $WN_x$. When operated for RPECVD, the flux of activated gas species partially dissociates and activates (in the gas phase) a non-plasma gas in the processing chamber 12. The flux of the activated gas species reacts and orders the activated non-plasma gas species onto the substrate 14 within the processing chamber 12 of the remote plasma enhanced chemical vapor deposition reactor system as depicted in FIG. 1.

Deposition processes typically take place in a cold wall vacuum processing chamber in which pressure has been reduced to between 0.1 and 100 torr, preferably a pressure of about 0.5 torr. A wafer 14, e.g., on which the deposition will be performed, is mounted on a chuck 16, which may be heated (if desired) to a temperature within a range of about 200°–600° C. by a heat lamp array or other standard means (not shown). A non-plasma gas enters the bubbler apparatus 17. A non-plasma gas flow rate of about 100 sccm is maintained through the bubbler apparatus 17 during the deposition process. Other techniques for vaporizing a semi-volatile compound are also known in the art and may be used in place of the bubbler apparatus 17.

The activated species, and non-plasma gas, are ducted to a shower head 13, and non-plasma gas injector 15, respectively, from which they enter the processing chamber 12. Relatively uncontaminated material deposits on the surface of the wafer. It is hypothesized that as soon as the mixing of the activated species and the non-plasma gas has occurred, the activated species begin to dissociate the molecules of the non-plasma gas to form precursor molecules. Thus, the non-plasma gas and the activated species are mixed, preferably, in the processing chamber 12, or just prior to being ducted into the processing chamber 12 in a premix chamber (not shown), or in the showerhead 13. Reaction products and non-plasma gas species are then withdrawn from the chamber 12 via an exhaust manifold. Incorporated in the exhaust manifold are a pressure sensor 23, a pressure switch 24, a vacuum valve 25, a pressure control valve 26, and a blower 27. A particulate filter filters out solid reactants before the exhaust is vented to the atmosphere.

According to a preferred embodiment, at least a portion of the wall of processing chamber 12 comprises a transparent window 19. The window 19 may be made of quartz, sapphire, clear polymeric material, or other transparent materials or combinations thereof. In this embodiment, a photo-energy source 20 is juxtaposed outside the transparent window 19 to assist in maintaining the activation energy of the active species inside the processing chamber 12.

As indicated above, the photo-assisted apparatus of the invention is capable of performing a variety of processes, including, but not limited to, any plasma-enhanced process in which a remote plasma is desired, such as, annealing, low temperature chemical vapor deposition, nitridation, passivation, low temperature epitaxial growth, surface cleaning, anisotropic etching, high density plasma (HDP) processing, layer-by-layer deposition and/or annealing, and annealing of conductive layers to remove contaminants and improve layer composition.

Annealing processes utilizing the apparatus can be used for the healing of dielectrics, such as $Ta_2O_5$, $Si_3N_4$, $Al_2O_3$, $Zr_2O_3$, $SiO_2$, $SiO_xN_y$, as well as many others. In such a method, a substrate with a dielectric deposited in accordance with the invention is annealed in an environment containing one or more of the following: $O_3$, $O_2$, $N_2O$, NO, and $N_2$. Theses gases are flowed through the photo-assisted remote plasma unit to create active species. Annealing the materials in such an environment can remove contamination from the deposited film and reduce oxygen vacancies in such a film, which reduces leakage and improves the integrity of the film.

The annealing process of the invention can be utilized with dielectrics formed on a wafer by any conventional means. Chemical vapor deposition (CVD) or physical vapor deposition (PVD) deposition techniques are appropriate for forming the dielectric layer, as is growing a dielectric from the substrate. The dielectric layer can also be deposited by utilizing the enhanced plasma deposition techniques described above. Additionally, the deposition can be accomplished in the same processing chamber as the annealing procedure, or in a different location.

An example of the annealing-healing process using the apparatus utilizes $O_2$ and $N_2$ gases. The $O_2$ concentration can be from about 5% up to about 95%. The flow rate for these gases can be from about 100 sccm to about 15,000 sccm. The anneal temperature can be from about 300° C. to about 750° C. and the anneal time can be from about 30 sec to about 600 sec. During this process, the remote plasma unit 8 power is from about 600 to about 3000 W, the power to the energy source 7, here UV lamps can be used, for the species in transit through the conduit 10 can be from about 500 W to about 4000 W. At the processing chamber 11 the energy source can be about 500 W to about 4000 W, again UV lamps will suffice. Annealing the dielectric material under such conditions results in the healing properties discussed above.

Another example of the annealing-healing process using the apparatus utilizes $O_3$, $O_2$, and $N_2$ gases. The concentration of $O_3$ can be from about 5% to about 50% and the concentration of $O_2$ can be from about 10% to about 90%. The $N_2$ concentration can be from about 5% to about 85%. The gas flow rate can be from about 100 sccm to about 20,000 sccm. The material can be annealed at temperatures from about 300° C. to about 750° C. for about 30 sec to about 600 sec. The power use for the energy sources at the remote generator 8, the conduit 7 and the chamber 11 are similar to or the same as those discussed above in the preceding example. Again, the annealing process under the above conditions results in reduction of oxygen vacancies, thereby reducing leakage and improving film dielectric film integrity.

Annealing processes utilizing the apparatus can also be used to modify the surface characteristics of a dielectric material deposited in accordance with the invention. The top 10–35 Å of a dielectric film, such as $SiO_2$ of about 35 to 110 Å in thickness, can be changed to be $SiO_xN_y$, where x is 1.6 to 1.95 and y is 0.05 to 0.40. The top surface of a deposited dielectric may be desired to be altered to make the dielectric more resistant to dopant diffusion. This resistance improves device characteristics in devices such as DRAM field effect transistors, for example. A dielectric operating as a gate oxide in a FET, annealed by this process, will help maintain the necessary proportions of dopant concentrations and channel properties in the transistor, thereby maintaining proper transistor functioning. This annealing process is especially helpful in preventing the migration of boron ions.

An example of the annealing process to modify dielectric surface structure using the apparatus utilizes $N_2$ and $H_2$ gases. The concentration of $N_2$ can be from about 10% to about 90% and the concentration of $H_2$ gas can be from about 10% to about 90%. The total flow rate for the gases can be from about 100 sccm to about 20,000 sccm. The dielectric film is annealed at a temperature from about 300° C. to 750° C. for about 30 sec to 600 sec. In the remote plasma unit 8 the energy provided can be about 600 W to about 3,000 W. The energy at the transparent conduit 7 can be from about 500 W to about 4,000 W and the energy at the processing chamber 11 can be from about 500 W to about 4,000 W. Use of the apparatus to modify a dielectric under theses conditions will result in the improved device characteristics discussed above.

Another example of the annealing process to modify dielectric surface structure using the apparatus utilizes $NH_3$ and Ar gases. The concentration of $NH_3$ can be from about 10% to about 90% and the concentration of Ar gas can be from about 10% to about 90% . The total flow rate for the gases can be from about 100 sccm to about 20,000 sccm. The dielectric film is annealed at a temperature from about 300° C. to 750° C. for about 30 sec to 600 sec. In the remote plasma unit 8 the energy provided can be about 600 W to about 3,000 W. The energy at the transparent conduit 7 can be from about 500 W to about 4,000 W and the energy at the processing chamber 11 can be from about 500 W to about 4,000 W. Use of the apparatus to modify a dielectric under theses conditions will similarly result in the improved device characteristics discussed above.

Processes utilizing the apparatus may also be used for annealing conductive materials, such as TiN, among others. In such a method, a substrate with a conductive material deposited thereon is annealed in an environment containing active species of a desired gas or combination of gases, such as $NH_3$, $N_2$, and $H_2$. The gas or gases are flowed through the photo-assisted remote plasma unit to create active species. Annealing the materials in such an environment can remove contamination from the deposited film to improve the integrity of the film.

In this embodiment, the conductive material may also be deposited using the photo-assisted remote plasma unit. For example, to deposit TiN, $TiCl_4$ and $NH_3$ are used as precursors. At least one of the precursors is activated in the remote plasma generation region 8. Also, one or both of the precursors is transferred through the transparent conduit 10. It is possible to allow one precursor to enter the processing chamber 11, adsorb to the wafer and then evacuate the chamber 11. Then the second precursor can be flowed into the chamber 11 to react with the adsorbed first precursor. The above steps can then be repeated.

The annealing process of the invention can be utilized with conductive materials formed on a wafer by any conventional means, for example CVD or PVD. The conductive material can also be deposited by utilizing the enhanced plasma deposition techniques described above. Additionally, the deposition can be accomplished in the same processing chamber as the annealing procedure, or in a different location.

A preferred process of annealing a conductive layer is the annealing of a TiN layer deposited using a $TiCl_4$ and $NH_3$ chemistry. As is known in the art, a TiN layer deposited by a $TiCl_4/NH_3$ chemistry is often contaminated by residual Cl and annealing is needed to reduce the Cl concentration in the TiN layer. Described in more detail below is an embodiment of the invention for annealing a TiN layer to reduce a Cl concentration in the TiN layer. When the TiN layer is exposed to the activated species, the activated species react with Cl atoms in the TiN film causing Cl atoms to be removed from the TiN film. Also, nitrogen may then be further incorporated into the TiN layer thereby improving film composition.

The TiN layer is annealed in the presence of one or more of $NH_3$, $H_2$, and $N_2$. When a combination of $H_2$ and $N_2$ are used, the concentration of $H_2$ is preferably within the range of about 10% to about 90% and the concentration of $N_2$ is preferably within the range of about 10% to about 60%. The gas flow rate for these species can be from about 20 sccm to about 5,000 sccm. The material layer can be annealed at temperatures from about 100° C. to about 800° C. for about 0.1 sec to about 150 sec. During this annealing process, the remote plasma unit 8 utilizes about 100 W to about 10,000 W in generating the activated species. The energy source 7 along the conduit 10, preferably a photo-energy source 7, and more preferably UV lamps, maintains the activated state of the species in transit through the conduit 10. In maintaining the activate state or the species the energy source 7 utilizes about 100 W to about 5,000 W. At the processing chamber 11 the energy source 20 can utilize about 0 W to about 10,000 W; again UV lamps are preferred.

Alternatively, a conductive material may be annealed in a non-plasma photo-assisted process. Such a process is similar to the plasma processes described above, except that plasma generation at the remote plasma unit 8 is not used in relation to at least one gas to create an activated species. Instead, a desired gas, such as, for example, $NH_3$, $N_2$, $H_2$, or combination of gases, are flowed through transparent conduit 10, without being activated in the remote plasma generation region 8. In the conduit 10, the activated species are exposed to photo-energy by photo-energy source 7 and, thereby, achieve an increased energy to facilitate a subsequent annealing process. Annealing a conductive material (e.g. TiN) by such a partial non-plasma process, does not foreclose the use of plasma-assisted deposition of that conductive material, which is, in fact, one preferred embodiment.

A preferred low temperature chemical vapor deposition application is the deposition of $WN_x$. Nitrogen and hydrogen are passed through and activated in remote plasma generation region 8 using about 800–2000 W of microwave power. The active species then flows through the transparent conduit 10, with UV photo assist, to processing chamber 12, where $WF_6$ is then added to the processing chamber through the non-plasma gas injector port 15. The result is deposition of tungsten nitride thin film on substrate 14.

An additional preferred chemical vapor deposition process is the deposition of titanium. Hydrogen is passed through remote plasma generation region 8 and activated by microwave, RF or other suitable power source. Hydrogen plasma then flows through transparent conduit 10, with photo-assist, to processing chamber 12 where $TiCl_4$ is added through the non-plasma gas injector port 15. The result is deposition of a thin Ti film on substrate 14.

A low temperature epitaxial layer can be grown using argon passed through remote plasma generation region 8, along with silane and hydrogen being passed through the non-plasma gas injector port 15. The pressure in the processing chamber could be $1 \times 10^{-3}$ Torr at 750° C. Again, a photo-energy source, preferably UV lamps, sustains the activation level of the Ar gas as it is conveyed through a transparent conduit 10 to the processing chamber 12.

Another typical low temperature chemical vapor deposition process is oxide planarization technology for deposition of a planarized oxide layer on a surface having an uneven surface, e.g., hills and valleys. In this process, oxygen and argon are activated in remote plasma generation region 8, and transferred to processing chamber 12 with photo assist. Silane is added through the non-plasma gas injector port 15 to processing chamber 12. A large RF signal is applied to substrate 14 for a short planarization time which effects the actual planarization.

In another embodiment of the invention, semiconductor films are formed in a layer-by-layer process to provide better control of the resultant layer composition. Preferably, the layer-by-layer process comprises depositing a thin layer of material on a substrate, annealing the thin layer, and repeating the steps of depositing and annealing until a desired layer thickness is reached. One or both of the depositing and annealing steps may be performed according to a plasma process described herein. One or both of the depositing and annealing steps may also be a non-plasma photo-assisted process. It is possible that only one of the deposition and/or annealing steps utilizes plasma-assist. Additionally, the plasma-assist can be reserved for a single precursor of one or both of the deposition and anneal steps. In such processes, a non-plasma gas or gases can be flowed through the transparent conduit 10 where they are exposed to photo-energy by photo-energy source 7 and, thereby, achieve an increased energy to facilitate subsequent depositing or annealing processes.

The layer-by-layer process may also be conducted by repeatedly depositing thin layers of a material over a substrate, wherein at least one of the thin layers is deposited using the plasma-assist and the photo-assist of the invention. Preferably, each thin layer deposited by the layer-by-layer technique is within the range of approximately 2 Å to 10 Å.

One possible anisotropic etch process is the etching of silicon dioxide with selectivity to silicon. This is accomplished by passing $C_3F_8$ gas through remote plasma generation region 8 using about 60 watts of microwave power as well as about 200 volts peak to peak RF at 800 kHz and $5 \times 10^{-4}$ Torr. Another possible anisotropic etch process could be the etching of silicon. This is accomplished by passing $SF_6$ and argon gas through remote plasma generation region 8 and using about 600 watts of microwave power as well as about 100 volts peak to peak RF at 13.56 MHz and $3 \times 10^{-4}$ Torr. In each etch process, the transparent conduit 10 and photo-energy source 7 sustains the energy level of the active plasma species for efficient plasma processing in the processing chamber 12.

The above description illustrates preferred embodiments which achieve the objects, features and advantages of the present invention. Unless specifically stated otherwise above, the pressure, temperature, and other process parameters, and the power and frequencies used for plasma generation and photo-assisted maintenance of active species, can be widely varied, so long as photo-energy is utilized to help to sustain the energy of one or more active species as such species are transferred through a transparent conduit from a remote plasma generation region to a processing chamber. It is not intended that the present invention be limited to the illustrated embodiments. Any modification of the present invention which comes within the spirit and scope of the following claims should be considered part of the present invention.

What is claimed as new and desired for protection by U.S. Letters Patent is as follows:

1. A method of fabricating a semiconductor device, comprising:
   providing a substrate within a processing chamber;
   providing a conductive material layer over said substrate;
   generating an activated species in a remote plasma activation region;
   transferring said activated species from said remote plasma activation region through a conduit to said processing chamber, said conduit having a length and being provided with an array of photo-energy generators along at least a portion of said length, wherein photo-energy generated by said array maintains the activated state of said activated species during said transferring; and
   annealing said conductive material layer within said processing chamber to remove contaminants from said conductive material layer.

2. The method of claim 1, wherein said annealing of said conductive material layer occurs in the presence of said activated species.

3. The method of claim 1, further comprising transferring at least one non-plasma species through said conduit to said processing chamber and exposing said non-plasma species to photo-energy generated by said during said transferring.

4. The method of claim 1, wherein said conductive material layer is TiN.

5. The method of claim 4, wherein said annealing reduces a Cl concentration in said TiN conductive material layer.

6. The method of claim 4, wherein nitrogen is added to said TiN conductive material layer during said annealing.

7. The method of claim 1, wherein said activated species is selected from the group consisting of $NH_3$, $N_2$, and $H_2$.

8. The method of claim 1, wherein said activated species comprises $H_2$ and $N_2$.

9. The method of claim 8, wherein said activated species is about 10% to about 90% $N_2$.

10. The method of claim 8, wherein said activated species is about 10% to about 60% $H_2$.

11. The method of claim 1, wherein the annealing of said conductive material layer occurs at about 100° C. to about 800° C.

12. The method of claim 1, wherein the flow rate of said activated species is between about 20 sccm to about 5,000 sccm.

13. The method of claim 1, wherein said annealing occurs for between about 0.1 seconds to about 150 seconds.

14. The method of claim 1, wherein said power of said photo-energy is between about 100 W to about 5,000 W.

15. The method of claim 1, wherein said conductive material layer is formed over said substrate in a location remote from said processing chamber and said substrate is transferred to said processing chamber for said annealing.

16. The method of claim 1, wherein said conduit comprises a non-reactive polymer and a second inert transparent material.

17. The method of claim 1, wherein said conduit comprises quartz or sapphire.

18. The method of claim 1, wherein said conduit comprises concentric layers of quartz and a non-reactive polymer.

19. The method of claim 1, wherein said array of photo-energy generators comprise ultraviolet lamps.

20. The method of claim 1, wherein said array of photo-energy generators comprise lasers.

21. A method of fabricating a semiconductor device, comprising:
providing a substrate within a processing chamber;
providing a conductive material layer over said substrate;
transferring at least one gas through a conduit to said processing chamber; and
exposing said gas to photo-energy generated by an array along at least a portion of said conduit during said transferring; and
annealing said conductive material layer within said processing chamber to remove contaminants from said conductive material layer.

22. The method of claim 21, further comprising generating an activated species in a remote plasma activation region, transferring said activated species from said remote plasma activation region through said conduit to said processing chamber, and wherein photo-energy generated by said array maintains said activated species in an activated state during said transferring.

23. The method of claim 21, wherein said step of providing a conductive material layer comprises generating an activated species in a remote plasma activation region, transferring said activated species from said remote plasma activation region through said conduit to said processing chamber, and wherein photo-energy generated by said array maintains said activated during said transferring.

24. The method of claim 21, wherein said conductive material layer is TiN.

25. The method of claim 24, wherein said annealing reduces a Cl concentration in said TiN conductive material layer.

26. The method of claim 24, wherein nitrogen is added to said TiN conductive material layer during said annealing.

27. The method of claim 21, wherein said array of photo-energy generators comprises ultraviolet lamps.

28. The method of claim 21, wherein said array of photo-energy generators comprises lasers.

* * * * *

UNITED STATES PATENT AND TRADEMARK OFFICE
CERTIFICATE OF CORRECTION

PATENT NO. : 6,930,041 B2
DATED : August 16, 2005
INVENTOR(S) : Vishnu K. Agarwal It is certified that error appears in the above-identified patent and that said Letters Patent is hereby corrected as shown below:

Column 7,
Line 64, "theses conditions" should read -- these conditions --;

Column 8,
Line 12, "theses conditions" should read -- these conditions --;

Column 11,
Line 4, "said during" should read -- said array during --;
Line 20, "100º C." should read -- 100º C --;

Column 12,
Line 29, "activated during" should read -- activated state during --.

Signed and Sealed this

Seventh Day of February, 2006

JON W. DUDAS
*Director of the United States Patent and Trademark Office*